(12) United States Patent
Bierhuizen et al.

(10) Patent No.: US 8,033,691 B2
(45) Date of Patent: Oct. 11, 2011

(54) LED LAMP PRODUCING SPARKLE

(75) Inventors: Serge Bierhuizen, Santa Rosa, CA (US); Mark Butterworth, Santa Clara, CA (US)

(73) Assignees: Koninklijke Philips Electronics N.V., Eindhoven (NL); Philips Lumileds Lighting Company, LLC, San Jose, CA (US)

( * ) Notice: Subject to any disclaimer, the term of this patent is extended or adjusted under 35 U.S.C. 154(b) by 253 days.

(21) Appl. No.: 12/464,486

(22) Filed: May 12, 2009

(65) Prior Publication Data
US 2010/0290234 A1 Nov. 18, 2010

(51) Int. Cl.
*F21V 5/00* (2006.01)

(52) U.S. Cl. .......... 362/311.02; 362/311.01; 362/311.03

(58) Field of Classification Search .................. 362/311, 362/800, 310, 351, 311.02, 311.01, 311.03; 313/498, 512, 110; 250/552, 553
See application file for complete search history.

(56) References Cited

U.S. PATENT DOCUMENTS

| | | | |
|---|---|---|---|
| 3,821,590 A | 6/1974 | Kosman et al. | |
| 4,013,915 A | 3/1977 | Dufft | |
| 4,086,483 A | 4/1978 | Freund et al. | |
| 7,670,031 B2 * | 3/2010 | Ogawa et al. | 362/311.02 |
| 2006/0027828 A1 | 2/2006 | Kikuchi | |
| 2008/0030986 A1 | 2/2008 | Ogawa et al. | |
| 2009/0020773 A1 | 1/2009 | Nomura et al. | |

FOREIGN PATENT DOCUMENTS

WO 9950915 A1 10/1999

* cited by examiner

*Primary Examiner* — John A Ward

(57) ABSTRACT

A substantially hemispherical lens surrounding an LED die is described that creates a sparkle as an observer views the lens from different angles. The lens is formed of an interconnected array of 100-10,000 or more lenslets. Each lenslet focuses an image of the LED die at an output of the lenslet such that the LED die image area at the output is less than ⅕ the area of the LED die to create a substantially point source image of the LED die at an outer surface of the lens. When the LED die is energized, the shape of each lenslet causes point source images of the LED die to be perceived by an observer at various viewing angles, such that the emitted LED light appears to sparkle and speckle as the observer moves relative to the lens.

15 Claims, 2 Drawing Sheets

U.S. Patent  Oct. 11, 2011  Sheet 1 of 2  US 8,033,691 B2
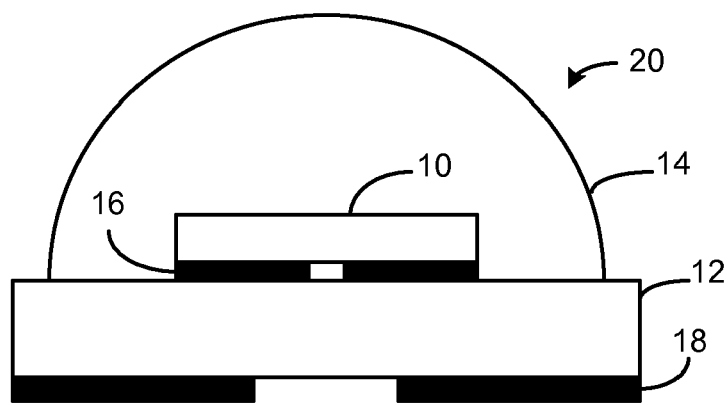
Fig. 1 (prior art)
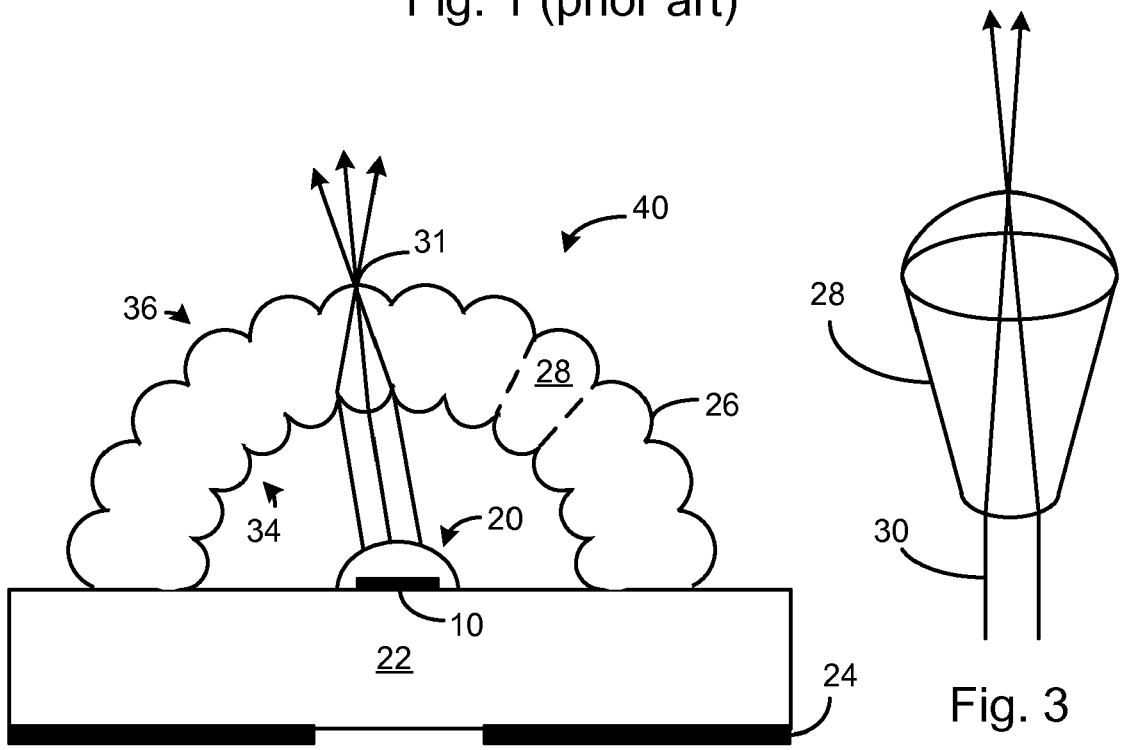
Fig. 2
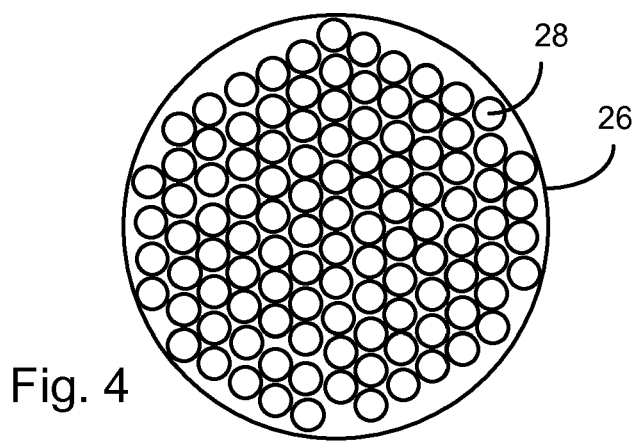
Fig. 3
Fig. 4

LED LAMP PRODUCING SPARKLE

FIELD OF INVENTION

This invention relates to lamps using light emitting diodes (LEDs) and, in particular, to a technique for creating a sparkling appearance of an LED lamp.

BACKGROUND

FIG. 1 is a cross-sectional view of a conventional flip-chip LED die 10 mounted on a submount 12 and encapsulated by a hemispherical lens 14. The emitted light creates a Lambertian pattern. The electrodes 16 on the bottom of the LED die 10 are bonded to metal pads on the submount 12, which are connected by vias to robust bonding pads 18 on the bottom of the submount 12 for soldering to a printed circuit board. The submount 12 may be any size. One or more phosphor layers may be overlying the LED die 10 so that the structure 20 can output any color light, including white. Such structures 20, outputting a variety of colors, can be purchased from the assignee.

In certain applications where aesthetics of the light emission are relevant, creating an attention-getting light emission may be desirable.

SUMMARY

A new LED lens is described that creates a sparkling effect to a human observer.

LED dies are on the order of 1 mm$^2$, and the emitted light across the surface of the die combines to form a non-coherent light. Such light does not sparkle. Sparkling is a characteristic which causes emitted light to appear to rapidly change brightness appearance upon movement of the light source or the observer.

A characteristic related to sparkle is called speckle, where the rods and cones in the human eye detect different brightnesses of a coherent light source (e.g., a laser) due to the constructive and destructive interference of the observed light across the retina. Speckle is a very interesting aesthetic effect that is not observed with LEDs due to its non-coherent nature.

To create a sparkle and speckle effect in accordance with one embodiment of the invention, a special lens is affixed over an LED die, where the die emits in a Lambertion pattern. The lens is generally hemispherical (dome shaped) and is molded to be essentially formed of an array of very small, interconnected lenslets. Each lenslet shapes the LED light received at its input surface into a substantially point source at its output surface so the LED die is imaged across the hemispherical array of lenslets as an array of bright point sources. The emitted light from each lenslet will be directional, so the observer will see one point source that is brighter than any others as the observer moves with respect to the light source.

In one embodiment, the LED die is substantially square with dimensions of about 1 mm per side, the lenslets are arranged over a hemispherical area spaced approximately 5 mm from the LED die where the hemisphere has a diameter of about 10 mm, and each lenslet has a diameter of about 1 to 1/100 mm. The lenslets will typically number 100-10,000 or more. Other shapes of lenses and lenslets are also described.

As the observer moves with respect to the light source, the light source will appear to sparkle. Further, since each lenslet creates a substantially point source image of the LED die, the observer's rods and cones see a partially coherent light emitted by a single lenslet, assuming the LED emits a narrow range of wavelengths. The point source essentially creates plane waves of light. The different rods and cones detect light that undergoes different degrees of constructive and destructive interference, causing the perceived light to have an interesting graininess that changes as the observer's eye moves with respect to the light source.

In a practical embodiment of a molded lens, the lenslets cannot create perfect point sources, and a practical achievable point source is on the order of about 1/25 the area of the LED die (an area of about 0.04 mm$^2$). This equates to a practical magnification by a lenslet of about 0.2. The term "substantially point source" should however be construed to be any LED image size area that is less than about 1/9 that of the LED die (a magnification of 0.33 or less).

In one embodiment, the inner surface of the lens comprises an array of convex lenses and the outer surface comprises a scattering surface, such as a suitable roughened surface. The roughened surface can be created by molding or by other means. The inner lenses create the point sources at the outer surface, and the scattering by the outer surface causes the point sources to be viewed at random angles relative to the lens.

The lens may be a single, integrated lens or two or more concentric lenses.

BRIEF DESCRIPTION OF THE DRAWINGS

FIG. 1 is a cross-sectional view of a conventional LED light source that emits a Lambertian pattern.

FIG. 2 is a cross-sectional view of an LED lamp that sparkles as an observer moves with respect to the lamp.

FIG. 3 is a perspective view of a single lenslet portion in the lens of FIG. 2.

FIG. 4 is a top down plan view of a hemispherical lens with lenslets.

Elements that are similar or identical in the various figures are labeled with the same numeral.

DETAILED DESCRIPTION

Figure 5:
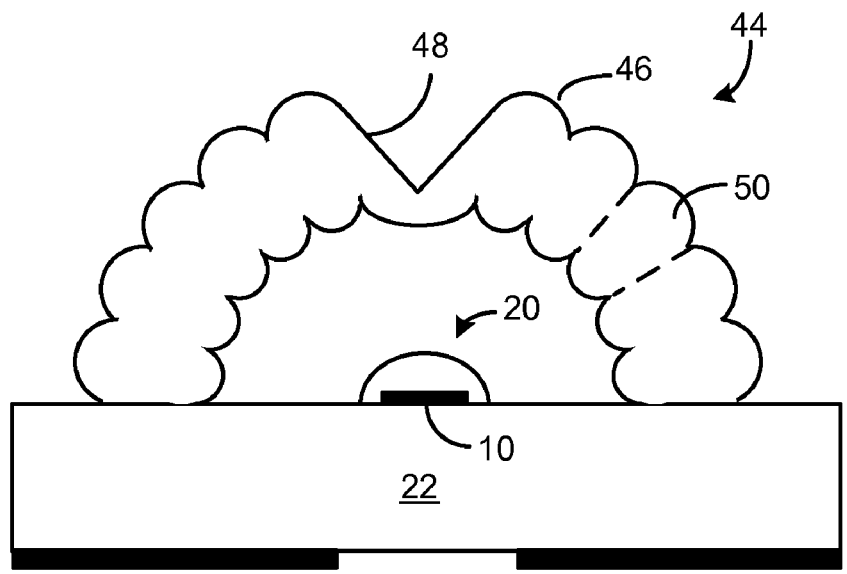
FIG. 5 is a cross-sectional view of an LED lamp similar to that of FIG. 2 but where the lens is a side-emitting lens.

In FIG. 2, the LED die 10 and encapsulating hemispherical lens 14 (a Lambertian lens) of FIG. 1 are supported by a base 22. The base 22 may be an enlarged submount 12 (FIG. 1), or the LED die 10 may be mounted on the submount 12 then mounted on a larger base 22. The base 22 has bottom electrodes 24 that are electrically connected to the anode and cathode electrodes on the LED die 10. In one embodiment, the LED die 10 emits light of a narrow wavelength, such as blue, green, amber, red or other color. The LED die 10 may also have a phosphor layer formed over it so that the emitted light has red, green, and blue components (or blue and yellow components) to create a white light.

A molded outer lens 26 is affixed over the LED die 10. The lens 26 may be silicone, plastic, glass, or any suitable polymer or other material. One skilled in the art can mold a transparent lens of any shape without undue experimentation.

In one embodiment, the LED die 10 has sides that are 1 mm, and the diameter of the generally hemispherical lens 26 is about 10 mm. However, virtually any diameter lens 26 will still perform the sparkling function.

The lens 26 is formed of an array of interconnected lenslets, each having a generally ice cream cone shape in one embodiment. One lenslet 28 is shown in FIG. 3. The emitted light from the LED die 10 (Lambertian) is shaped by all the lenslets substantially equally. Light rays 30 from the LED die 10 are shown being refracted by the lenslet 28, where the refraction is due to the shape of the lenslet 28 and the different indices of refraction of air and the lens material. The lenslet 28 shape is such that the LED light is focused at a point 31 on the outer surface of the lenslet 28 (the outer surface is at the focal length of the inner lens). An observer viewing a lenslet 28 normal to the lenslet 28 will perceive that lenslet 28 to be outputting a point of light that is much brighter than anywhere else on the lens 26, thus creating a sparkling effect as the perceived points of brightness over the lens 26 surface change depending on the observer's angle of view of the lamp 40.

The lens 26 essentially has an inner array of lenses 34 and a corresponding outer array of lenses 36. In one embodiment, each inner lens is convex and each outer lens is convex. Other lenslet shapes may be employed to create substantially point source images of the LED die 10 at the outer surface of the lens 26.

The lens 26 creates a speckle effect if the point source images are small enough. The observer's rods and cones, as part of the retina, see a partially coherent light emitted by each lenslet, where the different rods and cones detect light that undergoes different degrees of constructive and destructive interference, causing the perceived light to have a graininess that changes as the observer's eye moves with respect to the lamp 40. A point source image about 0.25 magnification (or less) of the 1 mm$^2$ die is sufficient for creating interesting speckle. A 0.25 magnification creates an LED die image area of about 0.06 mm$^2$ assuming a 1 mm$^2$ LED die.

The limit of speckle resolution on the retina is the Airy disk radius, given as x in the equation: $x=1.22\ \lambda f/d$, where $\lambda$ is the wavelength of the light, f is the focal length of the lens, and d is the diameter of the aperture. f/d is the f-number of a lens which, for a human eye, averages f/5.7 (assumes a 3 mm pupil diameter). To generalize, the smallest spot of light is about the f-number of the lens in microns, so an f/16 lens can create about a 16 micron diameter spot of light.

In one embodiment, the outer array of lenses 36 is replaced by a light scattering surface such as by a molded random array of prisms or by suitable roughening. The lens of FIG. 2 may therefore have an outer surface of small, randomly angled facets. There would normally be more scattering facets than inner lenses. The inner lenses create the point sources at the outer surface, and the scattering by the outer surface causes the point sources to be viewed at random angles relative to the lens. The point sources may also be subdivided by the scattering facets.

FIG. 4 is a top plan view of the lens 26 having an array of lenslets 28. An actual top down view will look different due to the aspect ratio change of each outer lenslet as the lens becomes more vertical near the edges. Since a circular lenslet 28 may have a diameter of only $\frac{1}{10}$ mm, there may be over 10,000 lenslets 28 in a 10 mm diameter lens 26. The lens 26 essentially emits a hemispherical array of bright points of light, so that different bright points are seen as the observer's viewing angle changes to produce a sparkle and speckle effect. Even an array of 100 lenslets would produce sparkle and speckle.

FIG. 5 is a cross-section view of a lamp 44 with a side-emitting lens 46 having a central, cone shaped notch 48 that internally reflects light towards the sides. The lenslets 50 perform in the same way as lenslets 28 in FIG. 2. Virtually any shape of a lens with lenslets is possible, and the shape depends on the particular application.

Figure 6:
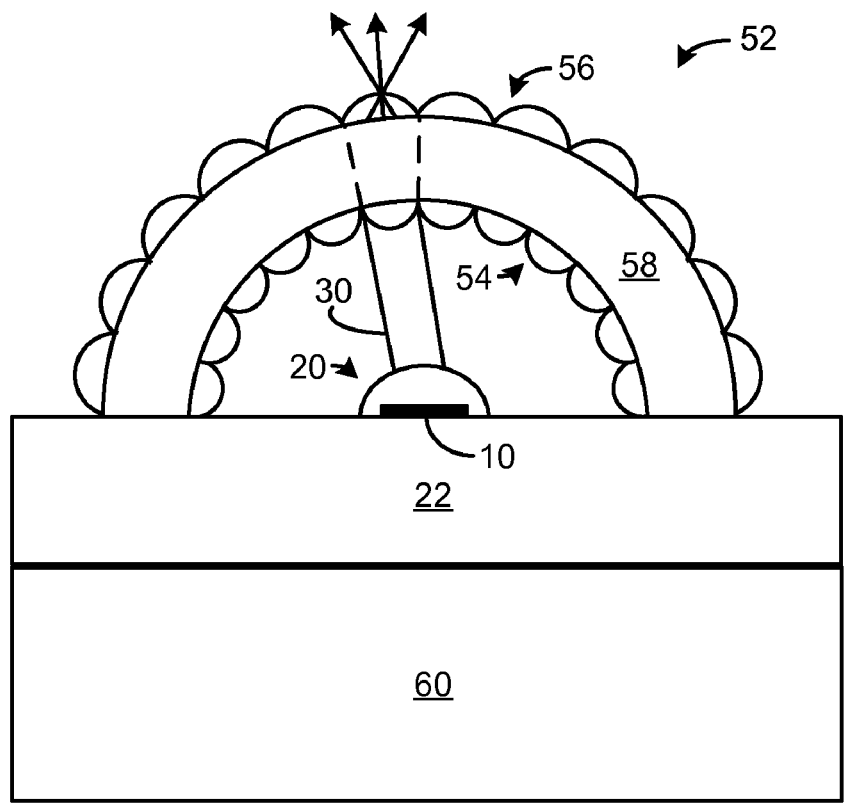
FIG. 6 is a cross-sectional view of an LED lamp where the lens is formed of spaced inner and outer lenses.

FIG. 6 illustrates a lens 52 formed of an inner lens portion 54 and an outer lens portion 56, with an air gap 58 in-between. The lens portions 54 and 56 produce point sources similar those produced by the lenslets 28 in FIG. 2. Instead of an air gap 58, silicone or other transparent material may fill the gap 58 and adhere the lens portions together for ease of handling. Surface 56 can also be a scattering surface in stead of a lens FIG. 6 also illustrates drive electronics 60 connected to the base 22 electrodes that may convert 120 VAC into a direct current for controlling the LED die 10. The lamp may be used as a decorative screw-in light bulb.

In one embodiment, the base 22 has mounted on it an array of sparkling lamps identical to those of FIG. 2, 5, or 6 to create a greater sparkling effect. The lamps may also be used for illumination if sufficiently bright. The base 22 may also be a printed circuit board.

The lens 26, 46, or 52 may be made any size, and a single lens may surround multiple LED dies 10 for brighter light output. The lens would typically have a diameter about ten times or less than a width of the LED die; however, the diameter may be any practical size while still achieving a sparkling effect.

In other embodiments, the inner and outer lenses may be offset or patterned to mask the visibility of the LED die. The far field pattern can be optimized for different application requirements.

Having described the invention in detail, those skilled in the art will appreciate that given the present disclosure, modifications may be made to the invention without departing from the spirit and inventive concepts described herein. Therefore, it is not intended that the scope of the invention be limited to the specific embodiments illustrated and described.

What is claimed is:

1. A light source comprising:
   a light emitting diode (LED) die affixed to a base; and
   a lens affixed to the base, the lens being positioned over the LED die to receive light from the LED die, the lens comprising an array of interconnected lenslets, each lenslet being shaped to focus light from the LED die such that an image area of the LED die at an output of the lenslet creates a reduced substantially point source optical image of the LED die at an outer surface of the lens.

2. The light source of claim 1 wherein the lens is substantially hemispherical and substantially surrounds the LED die.

3. The light source of claim 1 wherein there are more than 100 lenslets creating the lens.

4. The light source of claim 1 wherein a diameter of the lens is approximately equal to ten times a width of the LED die or less.

5. The light source of claim 1 wherein the lens has an inner surface comprising an array of convex inner lenses that substantially focus an image of the LED die at the outer surface of the lens.

6. The light source of claim 5 wherein the outer surface comprises an array of convex outer lenses.

7. The light source of claim 5 wherein the outer surface comprises a light scattering surface.

8. The light source of claim 1 wherein the lens has an inner surface comprising an array of convex inner lenses.

9. The light source of claim 1 wherein the lens is molded as a unitary piece.

10. The light source of claim 1 wherein the lens comprises an inner lens layer and an outer lens layer, with a gap between the inner lens layer and the outer lens layer, a combination of a portion of the inner lens layer and a corresponding portion of the outer lens layer forming a lenslet.

11. The light source of claim 1 wherein the lens has a diameter of 10 mm or less and substantially surrounds the LED die.

12. The light source of claim 1 wherein the LED die has a layer of phosphor over it.

13. The light source of claim 1 wherein the lens lets are shaped such that speckle is generated when the LED die is energized.

14. The light source of claim 1 where there is only a single LED die underlying the lens.

15. A method performed by a light source, the light source comprising a light emitting diode (LED) die and a lens overlying and substantially surrounding the LED die, the lens comprising an array of interconnected lenslets, the method comprising:

generating a substantially Lambertian light emission by the LED die;

receiving light from the LED die by each lenslet;

substantially focusing, by each lens let, an image of the LED die such that an image area of the LED die at an output of the lenslet is a reduced area of the LED die to create a substantially point source optical image of the LED die at an outer surface of the lens, wherein there are more than 100 lenslets creating the lens, and wherein each lens let creates a peak brightness point of the light source, as perceived by an observer plurality of peak when viewing the lens at a particular angle.

\* \* \* \* \*